United States Patent [19]
Motika et al.

[11] Patent Number: 5,983,380
[45] Date of Patent: Nov. 9, 1999

[54] WEIGHTED RANDOM PATTERN BUILT-IN SELF-TEST

[75] Inventors: Franco Motika, Hopewell Junction, N.Y.; Stephen V. Pateras, San Jose, Calif.; John James Shushereba, Essex Junction, Vt.

[73] Assignee: International Business Machines Corporation, Armonk, N.Y.

[21] Appl. No.: 08/931,558

[22] Filed: Sep. 16, 1997

[51] Int. Cl.[6] .................................................. G01R 31/28
[52] U.S. Cl. ............................................. 714/733; 714/30
[58] Field of Search .............................. 371/22.5, 22.31, 371/22.33, 22.6, 27.1, 27.2; 364/580, 581, 717; 324/765; 395/183.06; 714/30, 32, 705, 725, 726, 727, 728, 729, 733, 739, 761

[56] References Cited

U.S. PATENT DOCUMENTS

| | | | |
|---|---|---|---|
| 4,503,537 | 3/1985 | McAnney | 371/25 |
| 4,513,418 | 4/1985 | Bardell, Jr. et al. | 371/25 |
| 4,688,223 | 8/1987 | Motika et al. | 371/27 |
| 4,745,355 | 5/1988 | Eichelberger et al. | 324/73 R |
| 4,801,870 | 1/1989 | Eichelberger et al. | 324/73 R |
| 4,974,184 | 11/1990 | Avra | 364/717 |
| 5,043,988 | 8/1991 | Brglez et al. | 371/27 |
| 5,297,151 | 3/1994 | Gruetzner et al. | 371/27 |
| 5,323,400 | 6/1994 | Agarwal et al. | 371/22.3 |
| 5,369,648 | 11/1994 | Nelson | 371/27 |
| 5,394,405 | 2/1995 | Savir | 371/27 |
| 5,412,665 | 5/1995 | Groudis et al. | 371/27 |
| 5,414,716 | 5/1995 | Bershteyn | 371/27 |
| 5,479,414 | 12/1995 | Keller et al. | 371/22.3 |
| 5,485,471 | 1/1996 | Bershteyn | 371/27 |
| 5,612,963 | 3/1997 | Koenemann et al. | 371/27 |
| 5,617,531 | 4/1997 | Crouch et al. | 395/183.06 |

OTHER PUBLICATIONS

"The Weighted Random Test–Pattern Generator," *IEEE Transactions on Computers*, vol. C–24, No. 7, Jul. 1975, pp. 695–700.

*Primary Examiner*—Robert W. Beausoliel, Jr.
*Assistant Examiner*—Nadeem Iqbal
*Attorney, Agent, or Firm*—James M. Leas

[57] ABSTRACT

An integrated circuit comprising logic circuits and self-test circuits for testing logic circuits including a pseudo random pattern generator for generating at least one pseudo random pattern and weighing circuit for weighing the pseudo random pattern. The weighting circuit and pseudo random pattern generator generate a plurality of weighted pseudo random patterns including at least one pair of a first weighted pseudo random pattern and a second weighted pseudo random pattern that is the complement of the first pattern. A weighting instruction selects one of the first or second pseudo random patterns for testing the logic circuits.

20 Claims, 6 Drawing Sheets

WEIGHTED RANDOM PATTERN BUILT-IN SELF-TEST

CROSS REFERENCE TO RELATED PATENTS

U.S. Pat. No. 4,503,537 of common assignee herewith, issued Mar. 5, 1985, and incorporated herein by reference.

U.S. Pat. No. 4,513,418 of common assignee herewith, issued Apr. 23, 1985, and incorporated herein by reference.

U.S. Pat. No. 4,688,223 of common assignee herewith, issued Aug. 18, 1987, and incorporated herein by reference.

U.S. Pat. No. 4,745,355 of common assignee herewith, issued May 17, 1988, and incorporated herein by reference.

U.S. Pat. No. 4,801,870 of common assignee herewith, issued Jan. 31, 1989, and incorporated herein by reference.

FIELD OF THE INVENTION

The invention relates to integrated circuits having logic circuits and self-test circuits for testing the logic circuits and methods performed in integrated circuits for testing the logic circuits.

BACKGROUND OF THE INVENTION

Complex very large scale integrated circuit devices fabricated on a single semiconductor chip contain thousands of functional circuit elements which are inaccessible for discrete testing. Because of the complexity of the internal interconnections and their combinational interdependencies, testing for device integrity becomes increasingly time consuming as the number of circuit elements increases.

If by way of example a semiconductor chip were to have fifty input connections, the number of combinations of inputs is $2^{50}$. While one could apply that number of different input patterns, record the output responses, and compare those responses with the responses that ought to result, that is a herculean task and impossible for modern production testing.

A testing protocol as above-described, is described in the Giedd et al. U.S. Pat. No. 3,614,608 assigned to the assignee of the instant application. To reduce the number of patterns required for testing, Giedd et al. employed a random number generator to generate the test patterns. This expedient considerably reduces the number of patterns needed to test a device. This is true because a random pattern generator, unlike a binary counter, produces a succession of binary words wherein the split between binary zeros and ones approaches a 50% split for a substantial number of successive words, which number of words is considerably less than the total possible number of different words. Thus, each input to the device under test (DUT) has a 50% chance of receiving a binary zero or one input with a fewer number of input patterns.

A second expedient to reduce testing time is to employ weighted random patterns as inputs to the device under test (DUT). This ploy applies a statistically predetermined greater number of binary ones or binary zeros to the input pins of the DUT. The object is to apply a weighted test pattern that will have a maximum effect upon the inaccessible internal circuit elements.

A weighted random pattern test method is described by Carpenter et al. in U.S. Pat. No. 3,719,885 assigned to the assignee of the instant application. They employed a pseudo-random pattern generator to produce a random succession of binary words which were decoded from binary to decimal and the decimal taps connected together in groups of two, three, four, five, etc. to produce multiple or weighted outputs from the decoder. These outputs are then applied to a bit change which produces an output whenever it receives an input.

A further dissertation on weighted random pattern testing can be found in an article by H. D. Schnurmann et al. entitled "The Weighted IRandom Test-Pattern Generator", *IEEE Transactions on Computers*, Vol. C-24, No. 7, July 1975 at page 695 et seq.

Yet another expedient to improve testability is to build into the chip additional circuit connections for the sole purpose of testing. Obviously these circuits must be kept to a minimum, consistent with testing needs, because they reduce the availability of circuits for the routine function of the device. A device, exemplifying this built-in testability, is described in the Eichelberger U.S. Pat. No. 3,783,254, assigned to the assignee of the instant application. In Eichelberger, a shift register portion of a level sensitive scan device (LSSD) can receive inputs directly from an external connection and deliver an output, and are thus directly accessible for testing.

The use of "signatures" in lieu of a comparison of every individual test response with a known good output response is taught by Gordon et al. in U.S. Pat. No. 3,976,864.

While the prior art testing methods were suitable for testing devices of the then-existing complexity, the increase in circuit density requires more sophisticated testing techniques, not only to reduce testing time, but to assure the functional integrity of these devices. While a defective integrated circuit cannot be repaired, it would be most useful if one were able to diagnose the failure mode of the device to at least a few fault-prone elements so that process changes in the manufacturing of the device could be instituted to minimize the number of faults.

BIST (Built In Self Test) design, WRP (Weighted Random Pattern), and deterministic pattern test methodologies have evolved mainly in support of LSSD logic and structural testing, which is today the prevailing main design and test approach. The STUMPS structure shown in FIG. 1 illustrates a typical testing system 10 and chip design that incorporates these test methodologies. This structure utilizes a Linear Feedback Shift Register (LFSR) 12 which applies test vectors to an integrated circuit device under test (DUT) 14. After each clock cycle, a different test vector is applied to DUT 14. The outputs of DUT 14 are inputted into a Multiple Input Shift Register (MISR) 16.

These test methodologies allow for three distinct test modes. The first mode is based on deterministic LSSD and test techniques as shown and described in U.S. Pat. No. 3,783,254. It is fully compatible with the original structural test modes used since the early development of LSSD. In this mode the tester supplies the patterns to be loaded in each SRL (Shift Register Latches) chain and then pulses the appropriate system clocks. The problem encountered with this approach is that the generation and storage (at the tester) of the deterministic patterns is relatively expensive.

To overcome this problem the WRP methodology was developed. This second test mode utilizes a Linear Feedback Shift Register (LFSR) to algorithmically generate a set of pseudo random test patterns at the tester as shown and described in U.S. Pat. Nos. 4,688,223, 4,745,355 and 4,801,870. These patterns are then biased or weighted to optimize them for a specific logic design. In addition, a Multiple Input Signature Register (MISR) is used to compress the DUT responses into a signature for eventual comparison to a predetermined good signature. Although this approach has advantages in test pattern volumes and generation cost, it requires special tester hardware.

The third test mode is based on extending some of these techniques to BIST and incorporates the LFSR and MISR in the DUT. The advantage of this approach is that it lessens the dependency on external test hardware support. The problem encountered here is that the patterns generated by the LFSR are "flat random" patterns that usually result in relatively low test coverage or excessive test time.

What is needed is a solution for testing dense VLSI chips which combines all three techniques or test modes described above to balance the three test modes so as to optimize test time, test data volume, and test coverage.

SUMMARY OF THE INVENTION AND ADVANTAGES

Accordingly, the present invention is directed to an integrated circuit comprising logic circuits and self-test circuits for testing the logic circuits. The self-test circuits include a pseudo random pattern generator for generating at least one pseudo random pattern and a weighing circuit for weighing the pseudo random pattern. The weighing circuit includes an input for receiving a weighing instruction for selectively weighing the pseudo random pattern so that the weighing circuit and the pseudo random pattern generator generate at least one weighted pseudo random pattern for testing the logic circuits.

The present invention is also directed to an integrated circuit comprising logic circuits and self-test circuits for testing the logic circuits. The self-test circuits include a pseudo random pattern generator for generating at least one pseudo random pattern and a weighing circuit for weighing the distribution of the pseudo random pattern. The weighing circuit and the pseudo random pattern generator generates a plurality of weighted pseudo random patterns for testing the logic circuits, wherein the plurality of patterns include at least one pair of a first weighted pseudo random pattern and a second weighted pseudo random pattern that is the complement of the first pattern.

The present invention is also directed to a method for testing logic circuits in an integrated circuit. The method comprises the steps of generating, by the integrated circuit, at least one pseudo random pattern and weighing, by the integrated circuit, the pseudo random pattern to generate a plurality of weighted pseudo random patterns having at least one pair of a first weighted pseudo random pattern and a second weighted pseudo random pattern that is the complement of the first pattern.

The present invention is also directed to a method for testing logic circuits in an integrated circuit. The method comprises the steps of generating, by the integrated circuit, at least one pseudo random pattern and weighing, by the integrated circuit, the pseudo random pattern, and receiving, by the integrated circuit, a weighing instruction for selectively weighing the pseudo random pattern.

The present invention provides a consolidated and unique integral solution to the total BIST problem and provides the advantages of:

1. Consolidating into a single test methodology;
2. Utilizing existing test system base;
3. Reducing weighted random test data volumes;
4. Decreasing the overall test time when integrated with embedded arrays;
5. Executing WRP at system speed; and
6. Minimizing software support for diverse ATPG and TDS systems.

Furthermore, the present invention is usable in a system test environment and is extendable to fully integrated BIST without requiring special WRP test system hardware while allowing for a simpler design supporting flat random, deterministic, and weighed random pattern test modes.

DETAILED DESCRIPTION OF A PREFERRED EMBODIMENT OF THE INVENTION

The present invention solves the problem of low testability associated with present Built-in Self Test (BIST) designs. This problem arises as a result of using internally generated "flat random" patterns to test complex logic structures that are flat random pattern resistant.

In addition, the present invention reduces the test data volumes associated with external WRP or deterministic supplemental test patterns. These patterns are used to reduce the test time after the flat random patterns become ineffective. Furthermore, the need for special tester hardware required to support the WRP algorithmic generation can be eliminated. This allows a general purpose VLSI test system to be used with a method according to the present invention.

Strategically, the present invention consolidates multiple test methodologies into a single approach that can extend structural BIST from chip and module to system test.

Generally, the present invention combines a flat random BIST structure and a modified WRP concept into an extended BIST design. This design integrates on-chip the weighted pattern generation with external weight selection.

Figure 2:
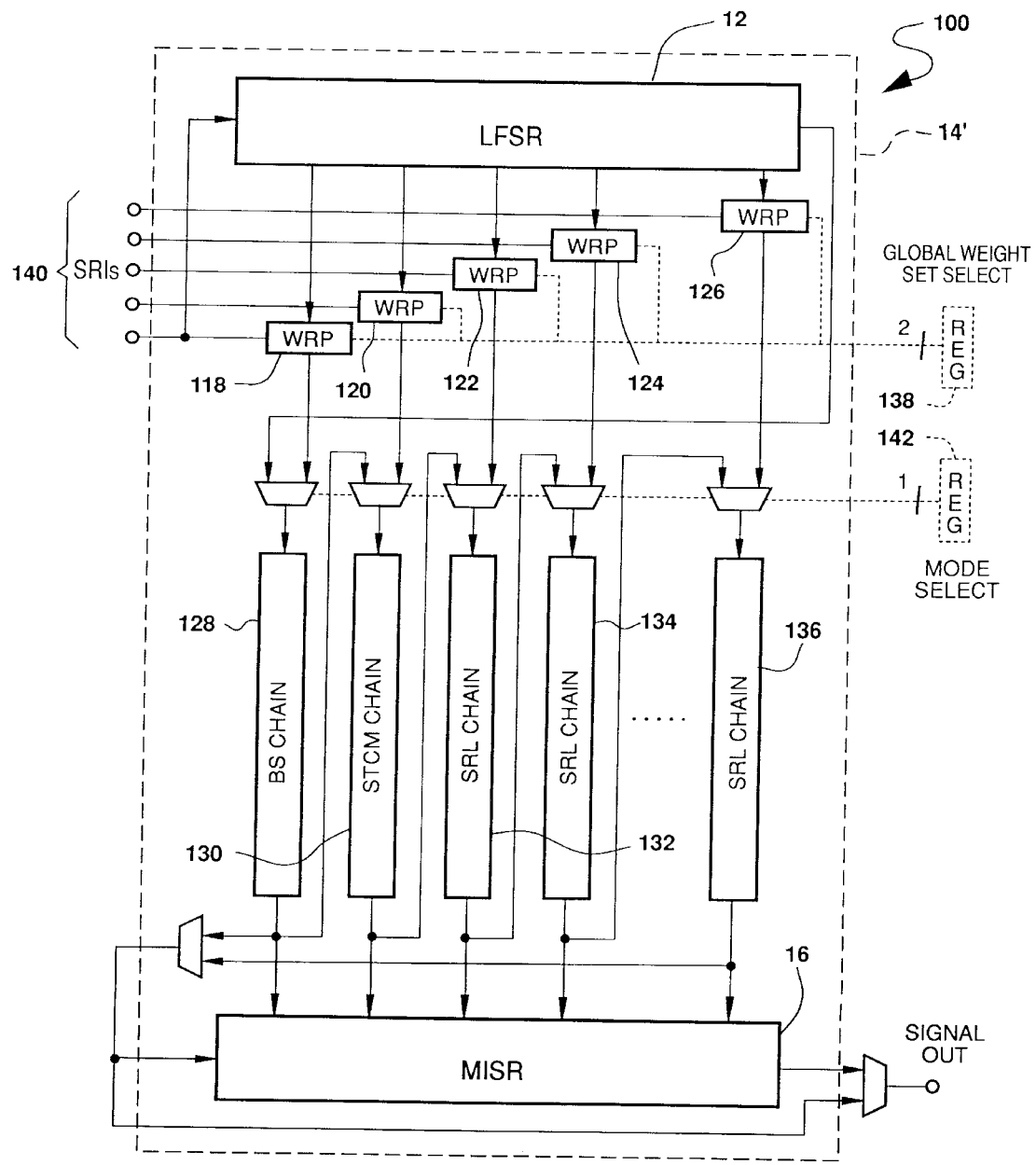
FIG. 2 is a block diagram illustrating an externally selectable WRPBIST structure according to the present invention.

The WRPBIST structure of the present invention is based on a couple of existing designs for test (DFT) methods such as LSSD, boundary scan, memory BIST, and the STUMPS architecture. The present invention extends the STUMPS configuration, as shown in FIG. 2, by incorporating the following test support functions to:

1. Generate weighted random patterns
2. Select sets of paired global weight factors
3. Externally apply specifically weighted bits
4. Allow for compatibility with existing test modes In addition to the built-in hardware support, the present invention is based on a somewhat different WRP methodology. This methodology utilizes sets of paired global weight factors rather than multiple weight sets. With the typical WRP test methodology, the WRP patterns are generated by the tester externally to the DUT and loaded via the shift register inputs (SRIs) into the chip's shift register latches (SRLs). A test (or LSSD tester loop sequence) consists of loading all the SRLs in all of the SR chains with a WRP, pulsing the appropriate clocks, and unloading the responses captured in the SRLs into the multiple input signature register (MISR). Each test can then be applied multiple times for each weight set, where the weight set consists of assigning a weight factor or probability to each SRL. The weight factor is typically of binary granularity with probabilities of "1" equal to $1/32$, $1/16$, $1/8$, $1/4$, $1/2$, $3/4$, $7/8$, $5/16$, or $31/32$.

The major difference between the WRPBIST methodology of the present invention and the typical one described above is that the weight factor consists of multiple pairs of complementary probabilities defined globally for all SRLs. For example, weight factors pairs (WFP) might include ($1/8$, $7/8$), ($1/32$, $31/32$), ($1/2$, $1/2$), or (+e,fra 0,1+ee ). The specific weight factor used to load each latch is determined by a single external bit applied to the corresponding shift register input (SRI). The result of a full SRL load is that each SRL gets loaded with a weighted random bit with probabilities relative to the selected weight factor pair (i.e. $P\{1\}=p$ or $P\{1\}=1-p$).

The same test vector (i.e., LSSD load) could be used multiple times with the same WFP until the desired test coverage is obtained. Also, the same vector could be reused with another WFP without additional tester pattern resources. The test coverage efficiency can be further enhanced by additional test vectors to focus on specific fault sets. In the extreme case the WFP of (0,1) would correspond to a deterministic test pattern, while on the other end the WFP of ($1/2$, $1/2$) would correspond to flat random patterns.

The typical WRPBIST test application sequence might consist of selecting a WFP and a corresponding subset of vectors. Each vector can then be executed multiple times in a typical test pattern loop. Alternatively, multiple WPF could be selected for each subset of vectors.

Figure 1:
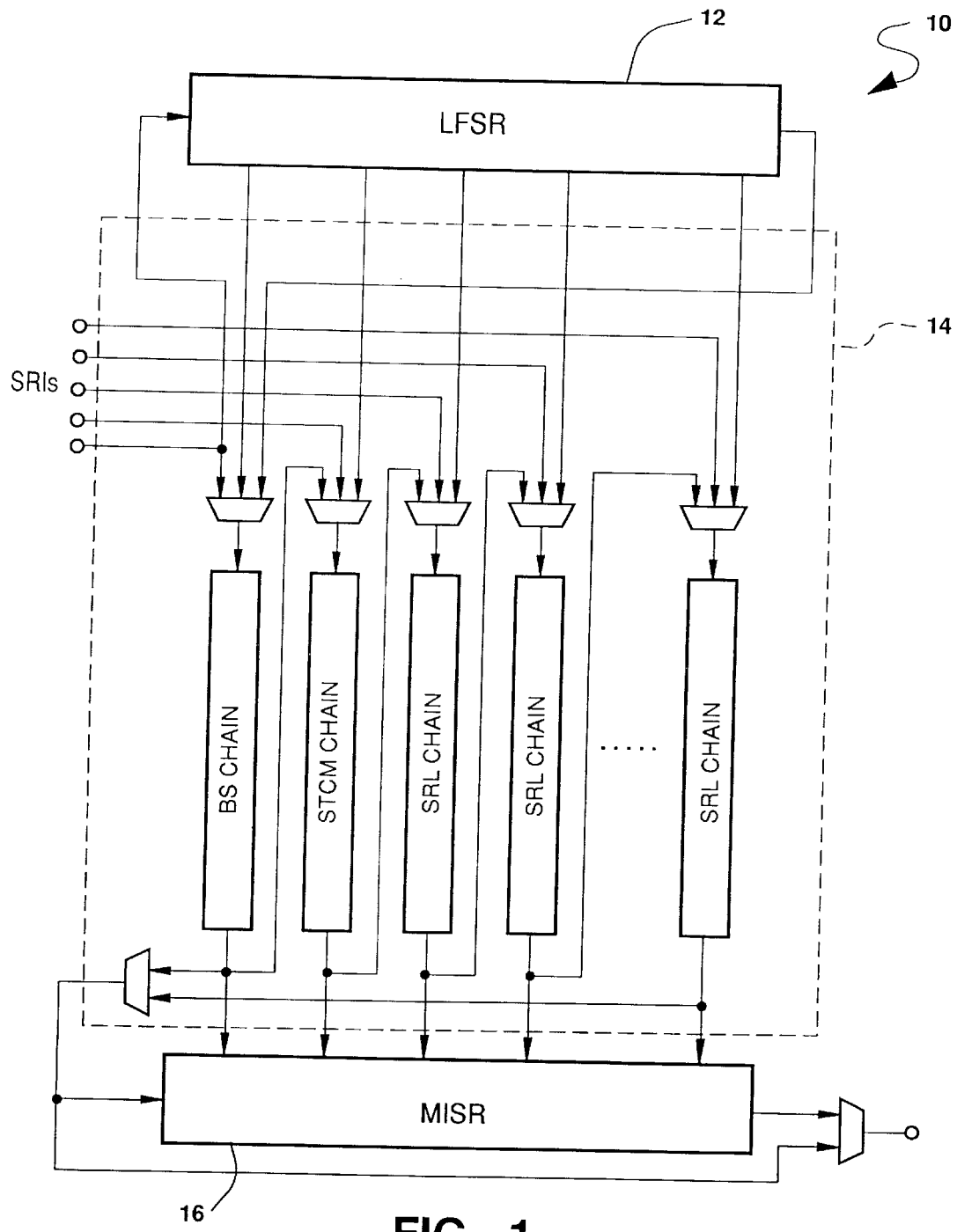
FIG. 1 is a block diagram illustrating a prior art STUMPS architecture.

Hardware implementation of the above methodology is relatively simple and requires very low circuit overhead. As mentioned above, WRPBIST can be easily incorporated into the STUMPS structure or as a stand alone DFT method. The basic configuration is shown in FIG. 2. Reference numerals utilized in FIG. 1 which are like, similar or identical to reference numerals utilized in FIG. 2 indicate like, similar or identical components.

Linear feedback shift register (LFSR) 12 is utilized to supply the flat pseudo random patterns to WRP generation sub functions 118, 120, 122, 124 and 126. The output of each WRP sub function 118, 120, 122, 124 and 126 feed BS chain 128, STCM chain 130 and SRL chains 132, 134, 136. A "global weight set select" register 138 provides the common selection of the WFP. SRI data or test vector 140 select the desired true or complement probabilities for each chain 128, 130, 132, 134, 136. A "mode select" signal from a mode select register 142 allows for normal LSSD or WRPLBIST test mode. The rest of the STUMPS structure, including the signature analysis (MISR) 16 remains unchanged from that shown in FIG. 1.

Figure 3:
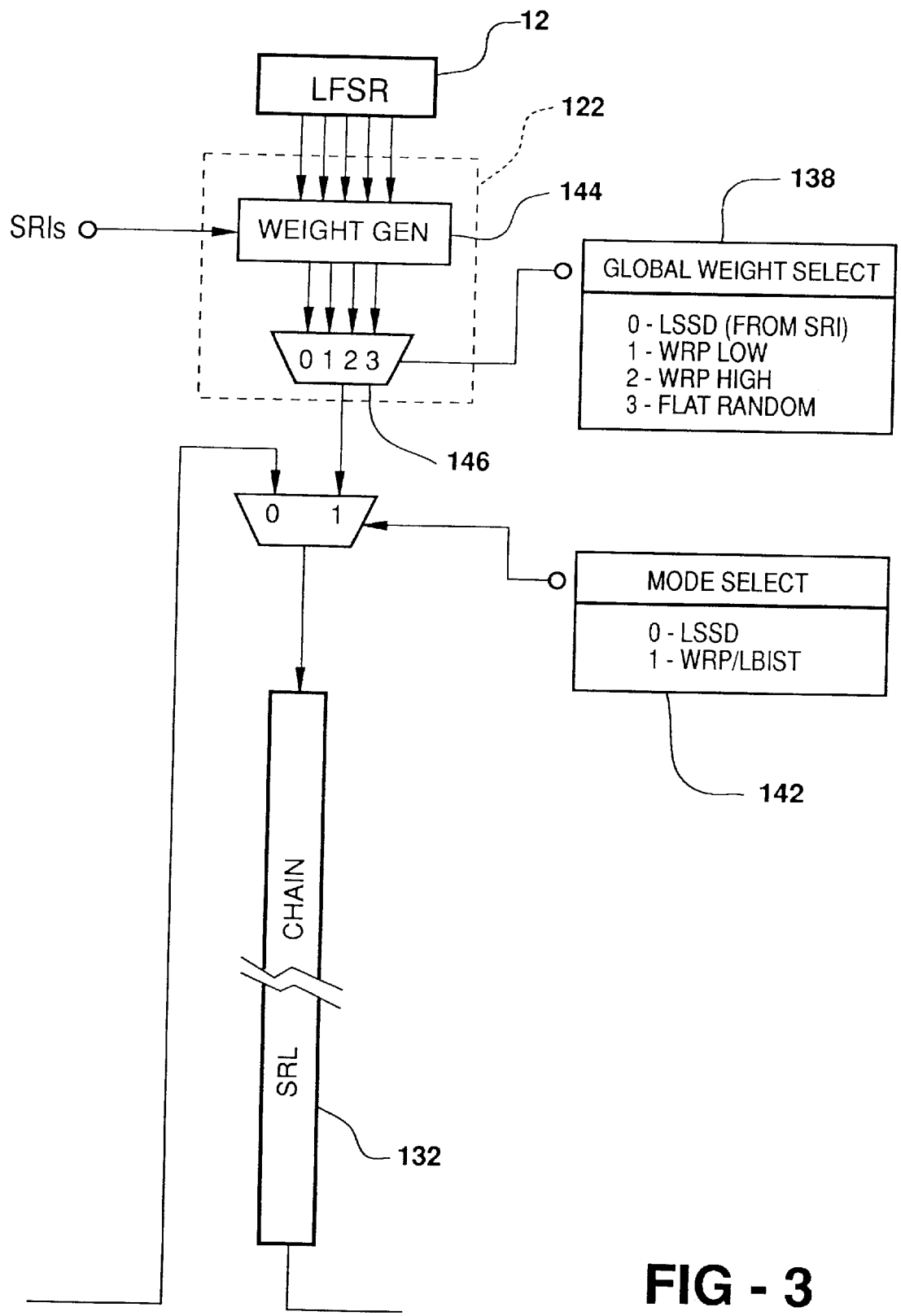
FIG. 3 is a block diagram illustrating the weight selection function of FIG. 2 according to the present invention.

FIG. 3 shows in somewhat more detail the WRPLBIST function supporting each chain 128, 130, 132, 134, 136. Reference numerals utilized in FIG. 3 which are like, similar or identical to the reference numerals utilized in FIG. 2 indicate like, similar or identical components. For the purposes of illustration, a configuration with four pairs of WFPs (0,1), ($1/32$, $31/32$), ($1/8$, $7/8$), and ($1/2$, $1/2$) have been selected. These correspond to the global weight selection from register 138 of LSSD, WRP Low probability, WRP High probability, and Flat Random respectively. Of course one is not limited to only four WFPs nor these specific values. Each WRP, such as 122 shown, comprises a weight generator or WRP generation function block 144 and a 4:1 MUX 146 having a selection input tied to register 138.

Figure 4:
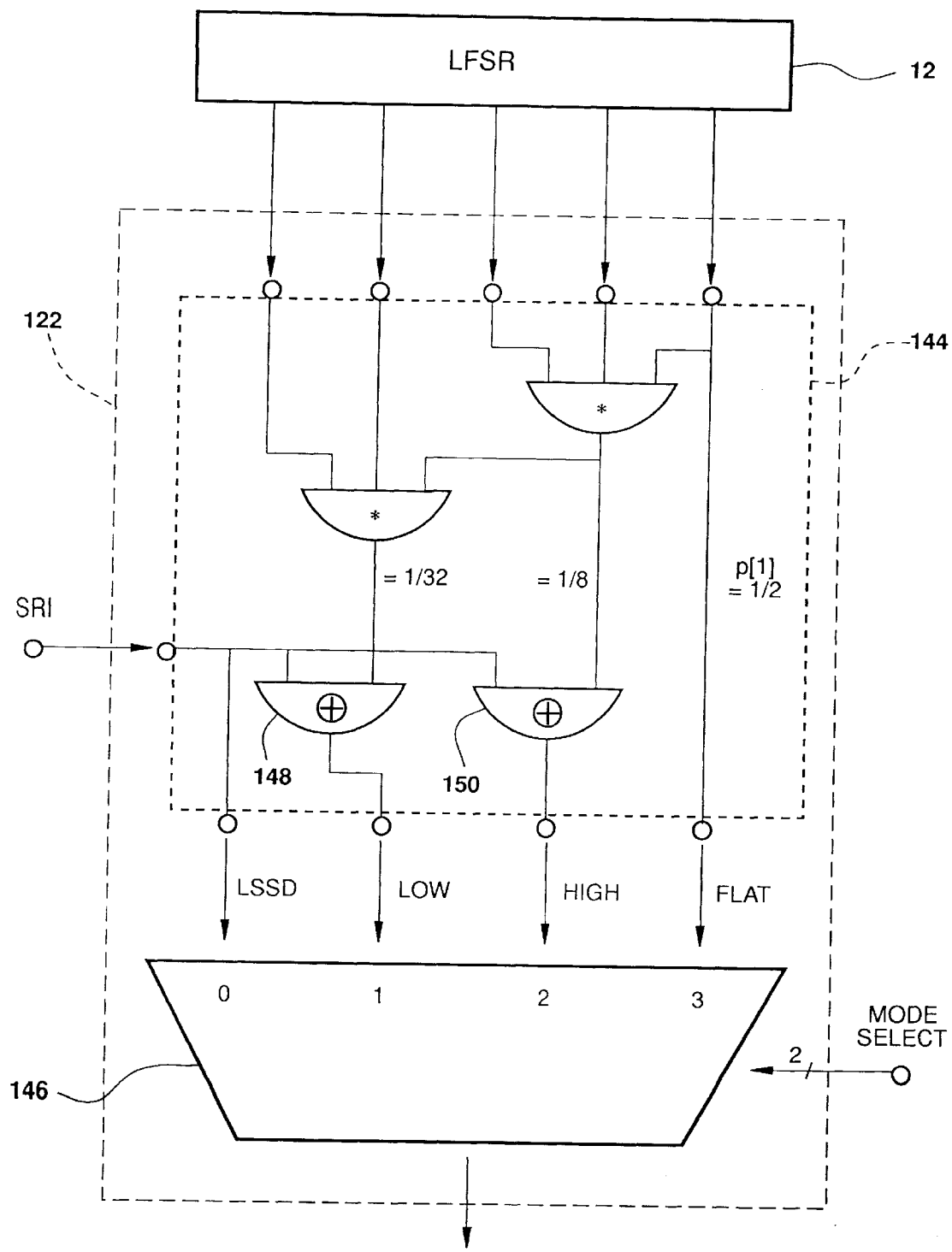
FIG. 4 is a block diagram illustrating the weight generation function of FIG. 2 according to the present invention.

The WRP generation function block 144 shown in FIG. 4 can be implemented with only a few logic blocks. Reference numerals utilized in FIG. 4 which are like, similar or identical to reference numerals utilized in FIG. 3 indicate like, similar or identical components. Block 144 obtains its input from LFSR 12 outputs, all of which generate $P\{1\}=1/2$ pseudo random patterns. By logically gating these LFSR 12 outputs the probabilities can be modified to any desired values. In the example shown, a very simple binary granularity probability weights are shown. Two XOR gates 148, 150 generate the p or 1−p complement probability signal as determined by the SRI bit. 4:1 MUX 146 selects the desired WFP. The logic circuit shown in FIG. 4 is intended to convey the concept, the actual implementation could be somewhat different depending on the technology, timing requirement, and other design considerations.

An additional benefit of this circuit is that it eliminates some of the linear dependencies associated with LFSR 12 due to the non-linear nature of the weight generation logic.

Although the WFP of ($1/2$, $1/2$) is shown for ease of explanation and compatibility with the STUMPS approach, practically one may implement a more effective WRP set.

Figure 5:
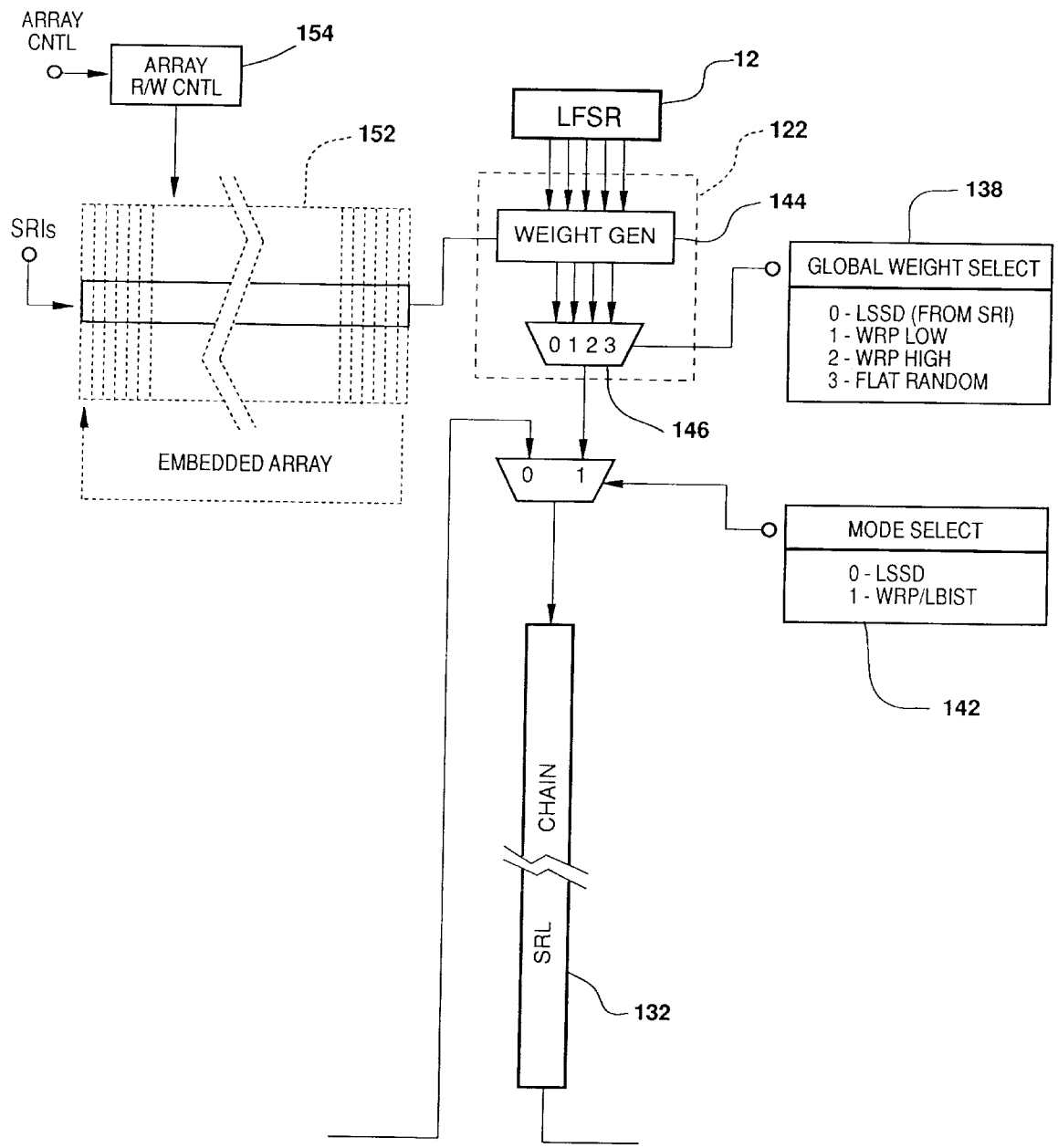
FIG. 5 is a block diagram illustrating an alternative embodiment of the weight selection function of FIG. 3 according to the present invention.

As more VLSI designs incorporate memory on chip one can extend the above concept into a fully integrated WRPBIST. This can be achieved by utilizing the system's embedded array to provide a temporary storage for the SRI vectors. FIG. 5 depicts a possible configuration wherein reference numerals which are like, similar or identical to reference numerals of FIG. 3 indicate like, similar or identical components. FIG. 5 illustrates an embedded array 152 and an array R/W control 154 for controlling array 152.

Figure 6:
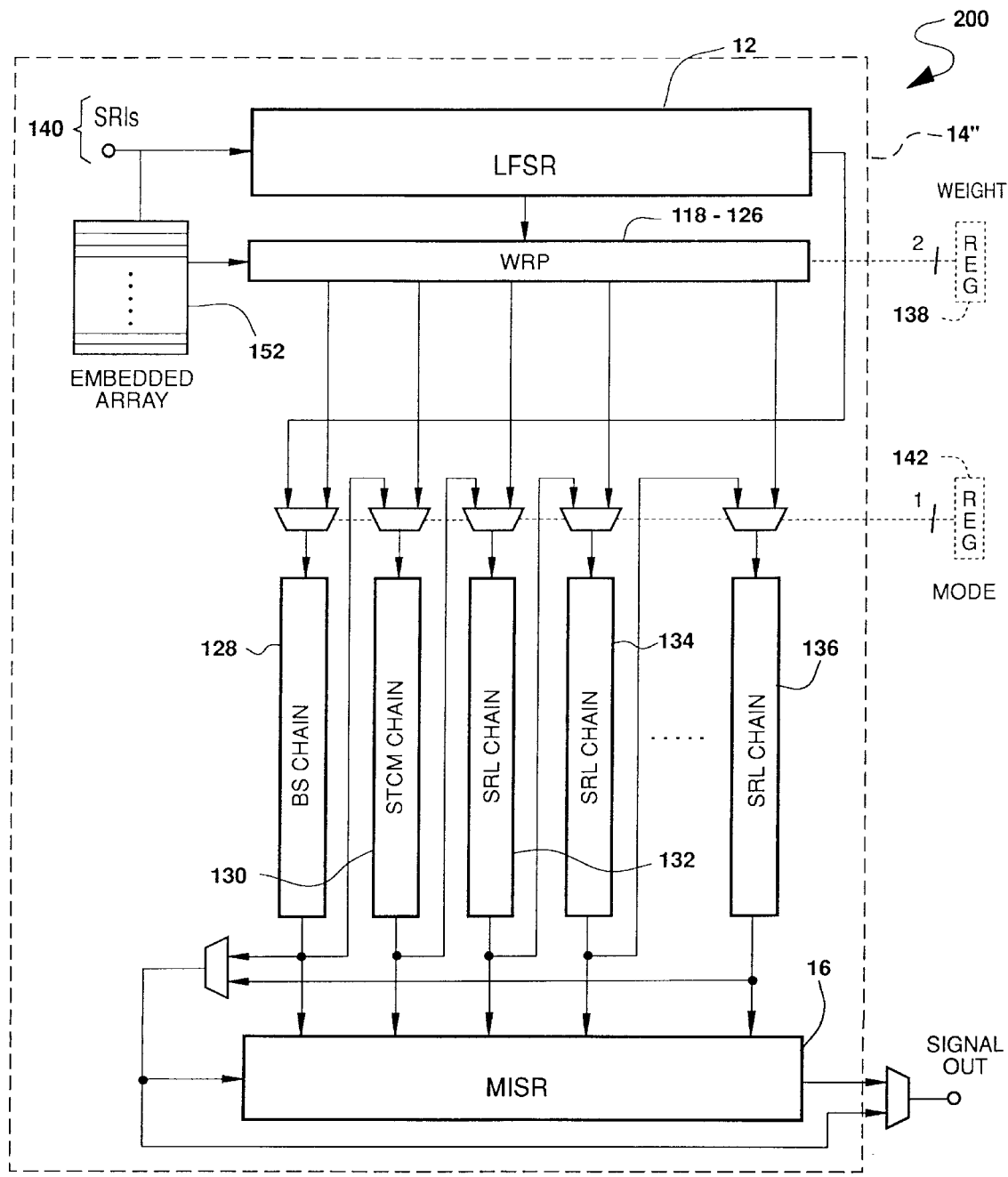
FIG. 6 is a block diagram illustrating an alternative embodiment of the externally selectable WRPBIST structure of FIG. 2 according to the invention.

Array 152 can be loaded with the desired vector set from the tester (or the system in system test mode) and then set the array in a loop sequence to apply as many WRP patterns as required. This could be further repeated with multiple sets of vectors. The sequencing could be controlled by the ABIST or LBIST engine running at system speeds. The minimum size of the array in this case needs to be configured for the length of the longest SRL string or chain and with a bit width of the number of SRL strings in the logic structure. FIG. 6 shows the full WRPBIST structure with the supporting embedded array wherein reference numerals which are like, similar or identical to reference numerals in FIGS. 2 and 5 indicate like, similar or identical components.

Although the present invention and its advantages have been described in detail, it should be understood that various changes, substitutions and alterations can be made herein without departing from the spirit or scope of the invention as defined in the appended claims.

What is claimed is:

1. An integrated circuit, comprising logic circuits connected to a scan chain and self-test circuits for testing said logic circuits, said self-test circuits comprising:

a pseudo random pattern generator for generating at least one pseudo random pattern;

a weighting circuit for providing a weight to said pseudo random pattern; and a selection circuit for providing said weighted pseudo random pattern to said scan chain for scanning said weighted pattern to said logic circuits.

2. An integrated circuit as recited in claim 1, wherein said weighting circuit comprises a weight generating circuit and a weight selecting circuit.

3. An integrated circuit as recited in claim 2, wherein said selection circuit comprises a multiplexor.

4. The integrated circuit, as recited in claim 1, wherein said weighting circuit includes means for receiving a weighting instruction from external to said integrated circuit.

5. The integrated circuit, as recited in claim 4, wherein said pseudo random pattern generator and said weighting circuit generate a plurality of weighted pseudo random patterns and wherein said weighting instruction from external to said integrated circuit selects one of said weighted pseudo random patterns for providing to said scan chain for testing said logic circuits.

6. The integrated circuit, as recited in claim 5, wherein said plurality of weighted random patterns include at least one pair of a first weighted pseudo random pattern and a second weighted pseudo random pattern, said second pattern being a complement of said first pattern.

7. The integrated circuit, as recited in claim 6, wherein said weighting instruction selects one of said first or second patterns for testing said logic circuits.

8. The integrated circuit, as recited in claim 4, wherein said weighting instruction is generated by a tester external to said integrated circuit.

9. The integrated circuit, as recited in claim 4, further comprising a memory or register array wherein at least a portion of said weighting instruction is stored in said memory array.

10. The integrated circuit, as recited in claim 9, wherein said weighting circuit and said pseudo random pattern generator generate a plurality of weighted pseudo random patterns including at least one pair of a first weighted pseudo random pattern and a second weighted pseudo random pattern, said second pattern being a complement of said first pattern.

11. The integrated circuit, as recited in claim 10, wherein said weighing instruction selects one of said first or second patterns for testing said logic circuits.

12. A method of testing an integrated circuit, comprising logic circuits connected to a scan chain and self-test circuits for testing said logic circuits, the method comprising:

a) generating a pseudo random pattern;

b) providing a weight to said pseudo random pattern; and c) providing said weighted pseudo random pattern to the scan chain for scanning said weighted pattern to the logic circuits.

13. The method as recited in claim 12, wherein said steps of generating and providing a weight generate a plurality of weighted pseudo random patterns for testing the logic circuits.

14. The method as recited in claim 12, further comprising the step of selecting one of said plurality of weighted pseudo random patterns for testing the logic circuits.

15. The method as recited in claim 13, wherein said plurality of weighted pseudo random patterns includes at least one pair of a first weighted pseudo random pattern and a second weighted pseudo random pattern, said second patten being a complement of the first pattern.

16. The method as recited in claim 15, further comprising the step of selecting one of the first or second patterns for testing the logic circuits.

17. The method as recited in claim 12, wherein said step (b) of providing a weight comprises the step of receiving a weighting instruction from external to said integrated circuit.

18. The method as recited in claim 17, further comprising the step of storinig said weighting instruction in a memory or register array of the integrated circuit.

19. The method as recited in claim 12, wherein said steps of generating and providing a weight generate a plurality of weighted pseudo random patterns including at least one pair of a first weighted pseudo random pattern and a second weighted pseudo random pattern, said second pattern being a complement of said first pattern.

20. The method as recited in claim 12, wherein said steps of generating a pseudo random pattern and providing a weight to said pseudo random pattern are accomplished with a circuit located on the integrated circuit.

* * * * *